United States Patent
Puri et al.

(10) Patent No.: US 7,536,611 B2
(45) Date of Patent: May 19, 2009

(54) HARD BISR SCHEME ALLOWING FIELD REPAIR AND USAGE OF RELIABILITY CONTROLLER

(75) Inventors: Mukesh K. Puri, Fremont, CA (US); Ghasi R. Agrawal, Sunnyvale, CA (US); Tuan L. Phan, San Jose, CA (US)

(73) Assignee: LST Corporation, Milpitas, CA (US)

( * ) Notice: Subject to any disclaimer, the term of this patent is extended or adjusted under 35 U.S.C. 154(b) by 697 days.

(21) Appl. No.: 10/700,177

(22) Filed: Nov. 3, 2003

(65) Prior Publication Data
US 2005/0097383 A1 May 5, 2005

(51) Int. Cl.
*G11C 29/00* (2006.01)
(52) U.S. Cl. ........................................ 714/710
(58) Field of Classification Search ............ 714/710, 714/711, 733
See application file for complete search history.

(56) References Cited
U.S. PATENT DOCUMENTS

| | | | |
|---|---|---|---|
| 5,961,653 A * | 10/1999 | Kalter et al. | 714/7 |
| 6,065,134 A * | 5/2000 | Bair et al. | 714/7 |
| 6,145,092 A * | 11/2000 | Beffa et al. | 714/7 |
| 6,185,709 B1 * | 2/2001 | Dreibelbis et al. | 714/726 |
| 6,477,662 B1 * | 11/2002 | Beffa et al. | 714/7 |
| 7,237,154 B1 * | 6/2007 | Zorian | 714/711 |

* cited by examiner

*Primary Examiner*—James C Kerveros
(74) *Attorney, Agent, or Firm*—Trexler, Bushnell, Giangiorgi, Blackstone & Marr, Ltd.

(57) ABSTRACT

A BISR scheme which provides for on-chip assessment of the amount of repair on a given memory and for the flagging of any device as a fail when the device exceeds a pre-determined limit. Preferably, a counter is built and loaded through a test pattern during production testing, and the counter establishes the threshold for pass/fail criteria. The BISR is configured to load a repair solution and then test the memories for any additional failures and if there are any, repair them (provided enough redundant elements are available). In addition, a reliability controller for BISR designs can be provided, where the reliability controller contains a register set and a number of counters at the chip-level which can be loaded through a test pattern during production tests, where one of the counters contains the number of memories to be allowed for repair.

17 Claims, 3 Drawing Sheets

HARD BISR SCHEME ALLOWING FIELD REPAIR AND USAGE OF RELIABILITY CONTROLLER

BACKGROUND OF THE INVENTION

The present invention relates to Built-In-Self Repair schemes and controllers for Built-In-Self Repair designs.

Built-in-Self-Repair (BISR) is a scheme wherein a certain amount of redundant elements are provided in each memory so that random process defects do not cause excessive yield loss. As shown in FIG. 1, current widely-used versions of BISR run different patterns at wafer-level to test the memories on the chip (box 10 in FIG. 1) and generate a repair solution which can be scanned out of the chip (via the flarescan mode) and written to an output file (box 12 in FIG. 1). The repair solutions are then programmed on the respective devices by blowing fuses (box 14 in FIG. 1). Thereafter, a power-on state machine (on-chip) repairs the memories (box 16 in FIG. 1). The power-on state machine runs a BISR mode called fusescan which loads the fuse values into the memories. This repairs the memories (soft-repair) after which they can be accessed in the functional mode.

However, with the current hard-BISR scheme, once the fuses are blown, there is no ability to rerun the BISR and repair any new failures that might occur during the life-time of the device. The repair is constrained to the information stored in the fuses.

Generally, memory contents have been increasing, and memories have higher defect densities than logic. As such, BISR is generally used in designs with large memory contents to repair defective memories. Parts which are repaired are prone to have higher reliability problems (DPM—defects per million). However, many companies which insist on certain reliability goals do not prefer to concede on DPM goals. Hence, it becomes necessary to screen these devices so as to reject the ones that exceed a certain threshold of repair beyond which they might pose a reliability risk over the lifetime of that device. The existing method requires that the repair solutions be logged to a file, and then post-processed to determine the extent of repair on each device and then screen out the ones that exceed a certain threshold. This takes time and often requires very extensive post-processing of data or maintaining complex production processes.

OBJECTS AND SUMMARY

An object of an embodiment of the present invention is to provide a hard-BISR scheme which includes provisions for repairing field failures.

Another object of an embodiment of the present invention is to provide a scheme which uses an on-chip circuit to analyze amount of repair on a device and modes which allow for field repair even with hard-BISR.

Still another object of an embodiment of the present invention is to provide a scheme which saves test time by not data-logging devices which would be thrown out and saves production setup and turn-around time.

Yet another object of an embodiment of the present invention is to provide a scheme which allows for the selective use of redundant resources for different products and also for different technology.

Still yet another object of an embodiment of the present invention is to provide a scheme which allows memory assessment on the fly during wafer testing.

Briefly, and in accordance with at least one of the foregoing objects, an embodiment of the present invention provides a BISR scheme which provides for on-chip assessment of the amount of repair on a given memory and for the flagging of any device as a fail when the device exceeds a pre-determined limit. Preferably, a counter is built and loaded through a test pattern during production testing, and the counter establishes the threshold for pass/fail criteria. The BISR is configured to load a repair solution and then test the memories for any additional failures and if there are any, repair them (provided enough redundant elements are available). In addition, a reliability controller for BISR designs can be provided, where the reliability controller contains a register set and a number of counters at the chip-level which can be loaded through a test pattern during production tests, where one of the counters contains the number of memories to be allowed for repair.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
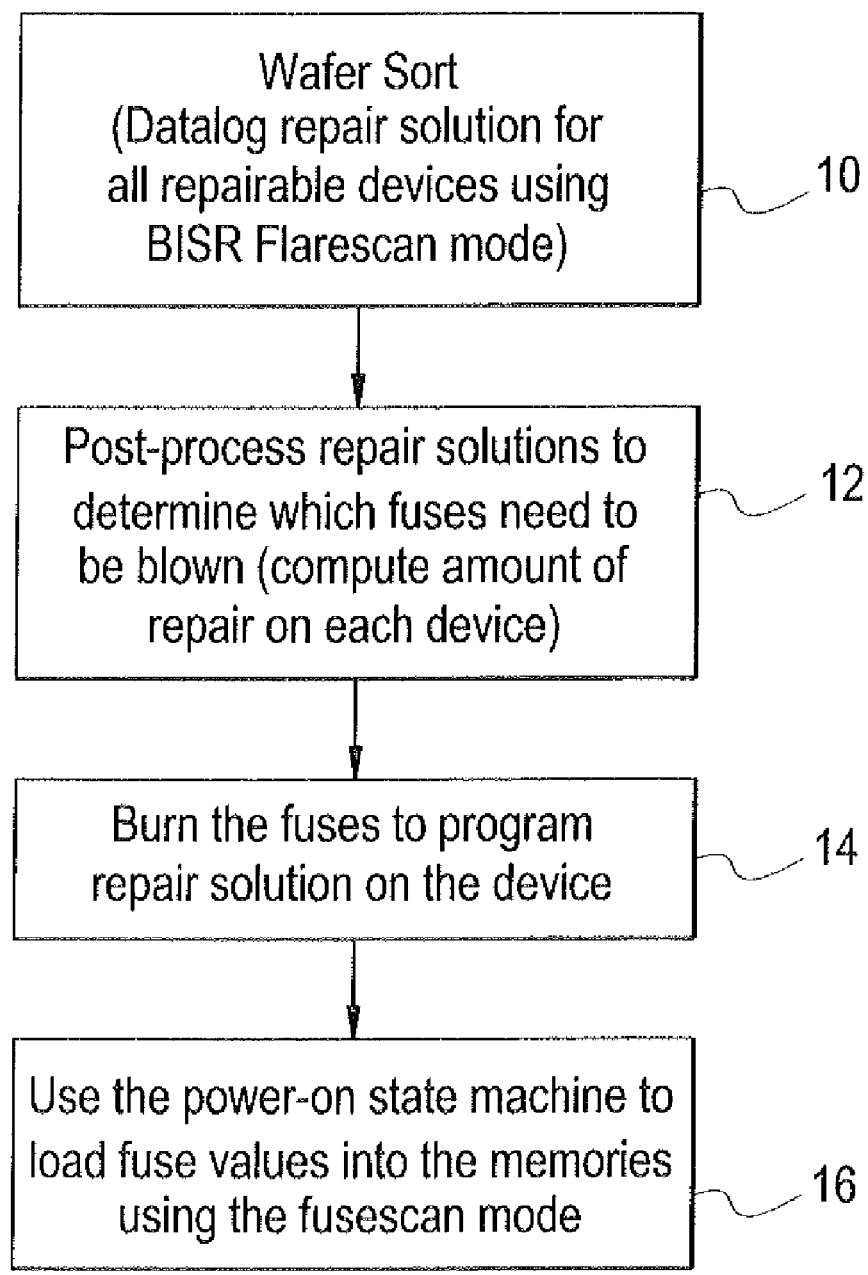
FIG. 1 illustrates a prior art BISR scheme.

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

Figure 2:
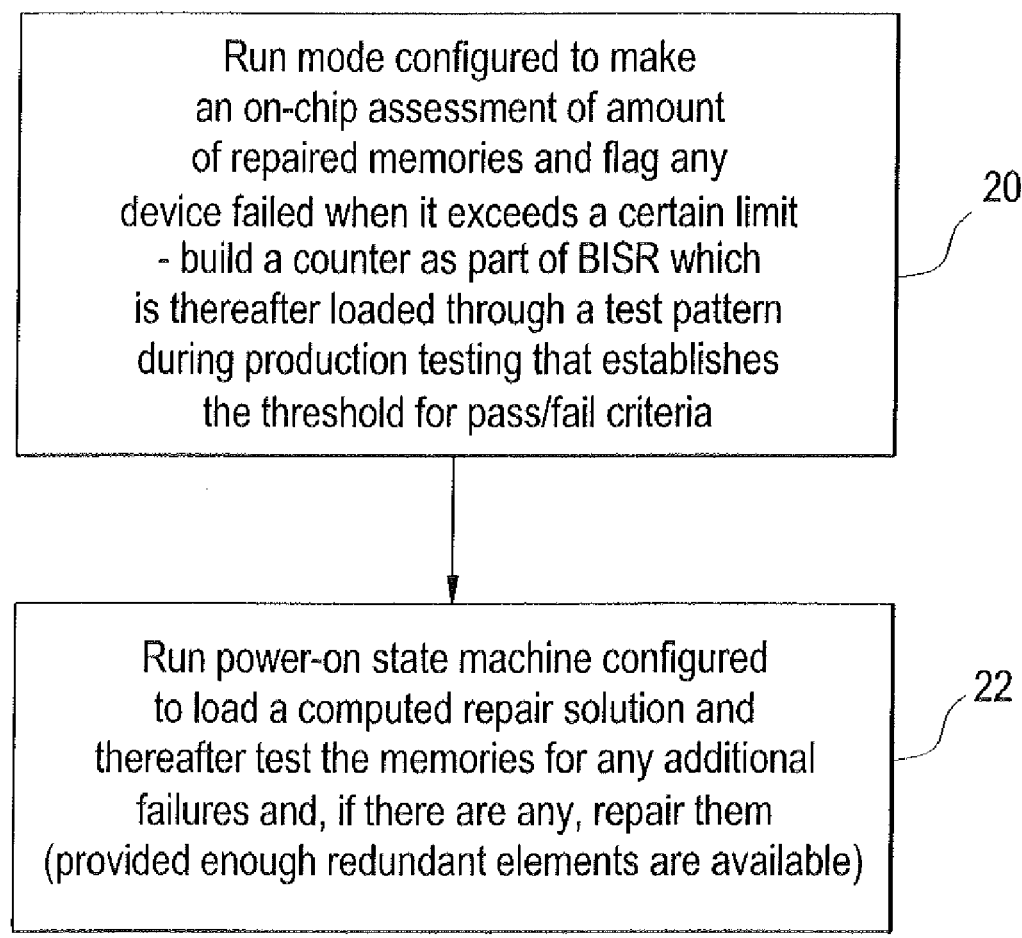
FIG. 2 illustrates a BISR scheme which is in accordance with an embodiment of the present invention.

As discussed above, with the hard-BISR scheme which is currently widely-used (see FIG. 1), once the fuses are blown, there is no ability to rerun the BISR and repair any new failures that might occur during the life-time of the device. The repair is constrained to the information stored in the fuses. Some field Repair scheme has been suggested. However, it does not make certain that some redundant elements are available in the field for extra field repair (not used in the factory). As shown in FIG. 2, an embodiment of the present invention provides a hard-BISR scheme which includes provisions for repairing field failures. The BISR scheme provides for on-chip assessment of the amount of repair on a given memory and for the flagging of any device as a fail when the device exceeds a pre-determined limit. Preferably, a counter is built and loaded through a test pattern during production testing, and the counter establishes the threshold for pass/fail criteria. The BISR is configured to load a repair solution and then test the memories for any additional failures and if there are any, repair them (provided enough redundant elements are available).

The BISR scheme can be implemented by effecting two modifications to an existing BISR:

a. Modify the repair information scan mode so as to ensure that every repairable device still has some unused redundant elements available for field repair. An efficient way of implementing this is to make the assessment on the fly during wafer testing itself. It reduces the test time and does not require very extensive post-processing of data or maintaining complex production processes. That means that the repair information scan mode needs to be modified so as to be able to make an on-chip assessment of the amount of repair on a given memory and flag any device as a fail when it exceeds a certain limit. However, since this repair limit may vary across technologies and products, it cannot be hard-wired in the BISR scheme itself but rather needs to be a variable entity. One possible way of doing that is to build a counter as part of BISR which can be loaded through a test pattern during production testing that would establish threshold for pass/fail criteria (box 20 in FIG. 2).

b. Modify the functionality of the power-on state machine so that it runs BISR accumulate mode after doing fuse scan. In such a case, Fuse scan loads the factory computed repair solution, and then the BISR accumulate mode tests the memories for any additional failures and if there are any, repair them (provided enough redundant elements are available) (box 22 in FIG. 2).

Such an embodiment provides a scheme which uses an on-chip circuit to analyze amount of repair on a device and modes which allow for field repair even with hard-BISR. This saves test time by not data-logging devices which would be thrown out and saves production setup and turn-around time. Moreover, the scheme allows for the control of use of redundant resources for different products and also for different technology. In addition, the use of redundant resources can be controlled to any value for the same product over the lifetime, i.e., for a product, less or more resources can be allowed at different times depending on the maturity of the process and reliability (Defects Per Million) required. The part of the scheme can also be used for soft BISR scheme where the amount of redundant element usage can be restricted to a certain amount, so that some additional field repair which may be necessary because of Early Failure Rate (EFR) or some other reasons.

Figure 3:
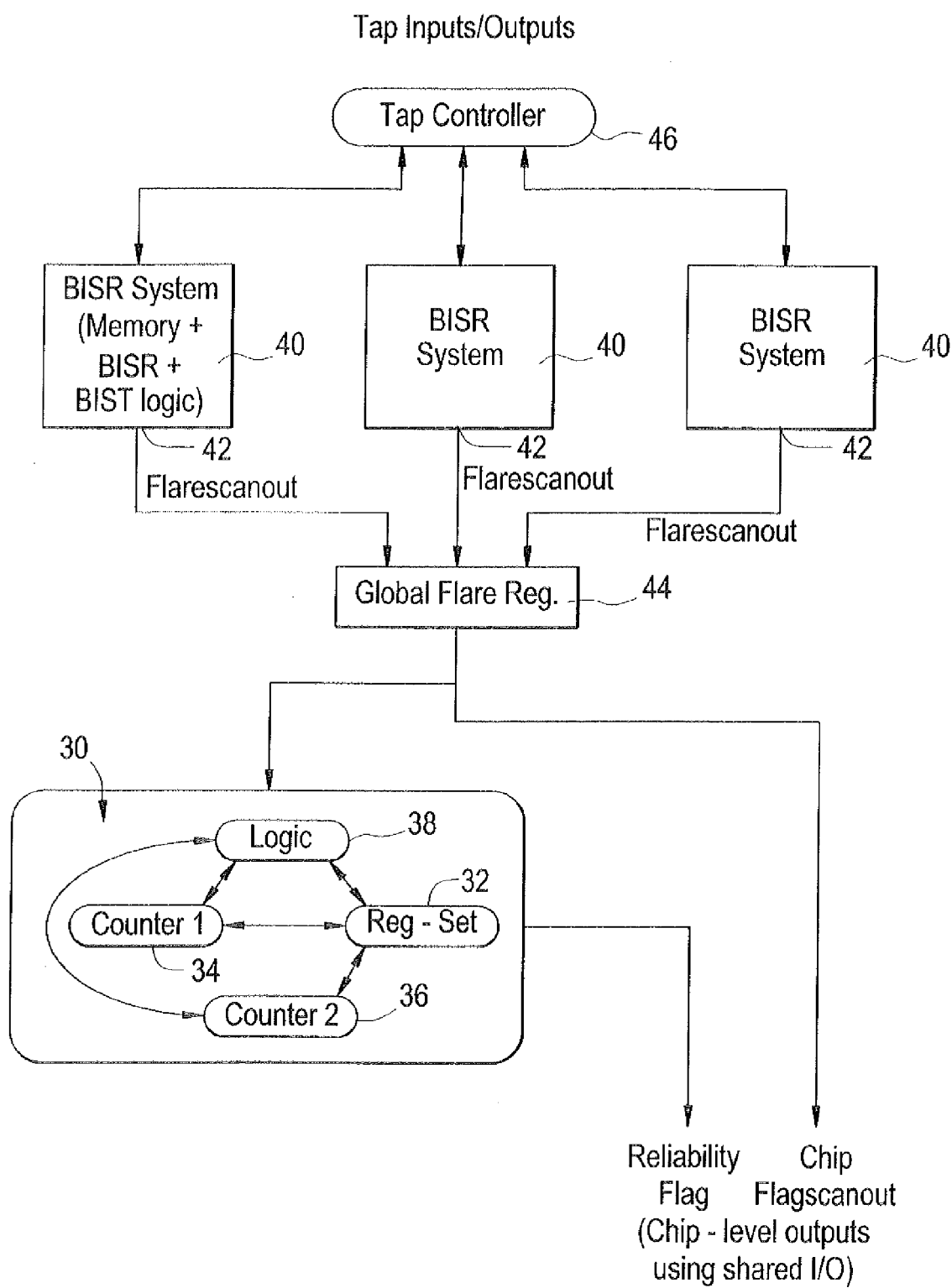
FIG. 3 illustrates a reliability controller for BISR designs, where the reliability controller is in accordance with another embodiment of the present invention.

FIG. 3 illustrates a reliability controller 30 for BISR designs, where the reliability controller 30 is in accordance with another embodiment of the present invention. The reliability controller 30 is configured to assess the number of repairable memories on the fly during wafer testing itself. It reduces the test time and does not require very extensive post-processing of data or maintaining complex production processes. That means that an on-chip assessment of the absolute amount of repairable memory needs to be done and any device which exceeds a certain limit needs to be flagged. However, since this repair limit may vary across technologies and in some cases across products, it cannot be hard-wired in the BISR scheme itself but rather needs to be a variable entity which may be varied from device to device. One possible way of doing that is to build a reliability controller 30 as shown in FIG. 3 which contains a Register set 32 and number of counters 34, 36 at the chip-level which can be loaded through a test pattern during production tests. One counter 34 (counter 1) contains the number of memories to be allowed for repair.

FIG. 3 also shows an example of how this logic is connected to the BISR Systems 40 at chip-level. The controller 30 contains two counters 34, 36, a set of registers 32 and some logic 38. The connection of the controller needs to be done to the logic 38 which scans out the repair information via flarescanout pins 42 from BISR system 40. (FIG. 3 shows an example of how repair information gets scanned out using global flare register 44. However, many companies do the scan out of repair information using Tap Controller 46 or through some other methods, and the basic idea of the reliability controller to be used with these types of logic remains the same for all kinds of implementations).

Counter 1 (34) contains a value which indicates the total number of repairable memories. This value gets loaded through the pattern. At the same time, two numbers are loaded in the register set 32—one indicates the total number of BISR memories in the design, and the other contains the maximum number of flare register bits among these memories. The logic 38 uses these two numbers to load another counter—counter 2 (36)—to create sections of patterns for each memory. The start of each section contains the redundant element usage information. Logic based on the counter 2 value is configured to get to the start of each section in the pattern and get the redundant element usage information.

Typically, the repair information contains some bits which will be "1" if redundant element is/are being used. The repair information also contains other information bits (for example, defective elements, number of defects etc.). The logic 38 within the reliability controller 30 reads the redundant element usage information and if it sees a "1" then it decrements the counter 1 value. Based on the number of repaired memories being allowed, the counter 1 reaches a value "0" if the chip has more than allowed repairable memories and that is when a FLAG (unreliable) would go high indicating that the memory is potentially unreliable and should be rejected.

The number of flare register bits can be different for different memories. However, logic (something similar to Global Flare Reg) can be utilized to normalize the length of the flare registers using patterns.

FIG. 3 illustrates an on-chip circuit to analyze the amount of repair required and flag the device as a failure if it exceeds pre-set limits. Moreover, the amount of repairable memories can be varied from design to design (based on the number of memories in the designs) and also for various technologies. At the same time, the same can be controlled at various times during the lifetime of the product. The method saves test time by not data-logging devices which would be thrown out and saves production setup and turn-around time.

While embodiments of the present invention are shown and described, it is envisioned that those skilled in the art may devise various modifications of the present invention without departing from the spirit and scope of the appended claims.

What is claimed is:

1. A method of performing built-in self repair of memories comprising:
    loading a value into an on-chip counter through a test pattern during production testing, where the value represents an amount of redundant elements which are allowed for a repair;
    testing the memories a first time;
    generating a repair solution;
    identifying memories which require a number of redundant elements for repair which exceeds the value that has been loaded into the on-chip counter;
    using the repair solution to repair a first set of damaged memories while not repairing and instead flagging a second set of damaged memories, wherein each of the memories in the second set have been identified as requiring a number of redundant elements to be used for the repair, where the number exceeds the value which has been loaded into the on-chip counter;
    making an on-chip assessment to test the memories a second time; and
    using the repair solution to repair damaged memories which were not previously flagged.

2. The method as recited in claim 1, further comprising loading the counter through a test pattern during production testing.

3. The method as recited in claim 1, further comprising loading a pre-determined repair solution into registers, testing the memories, and thereafter initiating the repair solution to repair the memories.

4. The method as recited in claim 3, further comprising using a reliability controller to test and repair the memories.

5. The method as recited in claim 4, said reliability controller comprising logic, at least one counter in communication with said logic, and a register set in communication with said logic.

6. The method as recited in claim 5, wherein said at least one counter comprises a first counter which contains the number of memories to be allowed for repair.

7. The method as recited in claim 6, further comprising loading a value into the register set which indicates the total number of memories.

8. The method as recited in claim 7, further comprising loading another value into the register set which indicates the maximum number of flare register bits among the memories.

9. The method as recited in claim 8, further comprising having the logic use the two values to create sections of patterns for each memory.

10. The method as recited in claim 9, wherein a start of each section contains redundant usage information.

11. A reliability controller configured for use in connection with built-in self repair of memories, said reliability controller configured to:
   load a value into an on-chip counter Through a test pattern during production testing, where the value represents an amount of redundant elements which are allowed for a repair;
   test the memories a first time;
   generate a repair solution;
   identify memories which require a number of redundant elements for repair which exceeds the value that has been loaded into the on-chip counter;
   use the repair solution to repair a first set of damaged memories while not repairing and instead flagging a second set of damaged memories, wherein each of the memories in the second set have been identified as requiring a number of redundant elements to be used for the repair, where the number exceeds the value which has been loaded into the on-chip counter;
   make an on-chip assessment to test the memories a second time; and
   use the repair solution to repair damaged memories which were not previously flagged.

12. The reliability controller as recited in claim 11, said reliability controller comprising logic, at least one counter in communication with said logic, and a register set in communication with said logic.

13. The reliability controller as recited in claim 12, wherein said at least one counter comprises a first counter which contains the number of memories to be allowed for repair.

14. The reliability controller as recited in claim 13, wherein the register set is configured to receive a value which indicates the total number of memories.

15. The reliability controller as recited in claim 14, wherein the register set is configured to receive a value which indicates the maximum number of flare register bits among the memories.

16. The reliability controller as recited in claim 15, wherein the logic is configured to use the two values to create sections of patterns for each memory.

17. The reliability controller as recited in claim 16, wherein a start of each section contains redundant usage information.

* * * * *